United States Patent
Kasanyal et al.

(10) Patent No.: US 7,236,013 B2
(45) Date of Patent: Jun. 26, 2007

(54) CONFIGURABLE OUTPUT BUFFER AND METHOD TO PROVIDE DIFFERENTIAL DRIVE

(75) Inventors: Sunil Chandra Kasanyal, Uttaranchal (IN); Rajat Chauhan, Uttaranchal (IN)

(73) Assignee: STMicroelectronics Pvt. Ltd., Uttar Pradesh (IN)

(*) Notice: Subject to any disclaimer, the term of this patent is extended or adjusted under 35 U.S.C. 154(b) by 120 days.

(21) Appl. No.: 11/022,577

(22) Filed: Dec. 22, 2004

(65) Prior Publication Data

US 2005/0179466 A1 Aug. 18, 2005

(30) Foreign Application Priority Data

Dec. 26, 2003 (IN) .......................... 1618/Del/2003

(51) Int. Cl.
   *H03K 19/0175* (2006.01)

(52) U.S. Cl. ......................... 326/83; 326/86

(58) Field of Classification Search ............ 326/82–89, 326/38
See application file for complete search history.

(56) References Cited

U.S. PATENT DOCUMENTS

| | | | | |
|---|---|---|---|---|
| 5,122,690 A | * | 6/1992 | Bianchi | 326/87 |
| 5,898,321 A | * | 4/1999 | Ilkbahar et al. | 326/87 |
| 6,433,585 B1 | * | 8/2002 | Patel et al. | 326/83 |
| 6,624,662 B1 | * | 9/2003 | Volk | 326/87 |
| 6,812,734 B1 | * | 11/2004 | Shumarayev et al. | 326/30 |
| 6,856,178 B1 | * | 2/2005 | Narayan | 327/108 |

* cited by examiner

*Primary Examiner*—Don Le
(74) *Attorney, Agent, or Firm*—Lisa K. Jorgenson; E. Russell Tarleton; Seed IP Law Group PLLC

(57) ABSTRACT

A configurable output buffer capable of providing differential drive having complementary pairs of CMOS transistors having a common output terminal and a common control terminal, and with the second terminal of each CMOS transistor connected to its corresponding supply terminal through a corresponding current source or current sink.

18 Claims, 9 Drawing Sheets

Fig. 5 (Conventional LVDS Driver)

CONFIGURABLE OUTPUT BUFFER AND METHOD TO PROVIDE DIFFERENTIAL DRIVE

BACKGROUND OF THE INVENTION

1. Field of the Invention

The present invention relates to a configurable output buffer and method to provide differential drive.

2. Description of the Related Art

In Floating Programmable Gate Arrays (FPGAs) and in other integrated circuit devices, Low Voltage Differential Signal (LVDS) interfacing is widely used because of several advantages of the differential signaling and low output swing. The main advantage of LVDS is its high speed data transmission rate with reduced noise and reduced electromagnetic interference (EMI).

FIG. 1 and FIG. 2 show schematic block diagrams for existing schemes of providing LVDS capabilities with other general-purpose I/O standards in programmable devices.

In FIG. 1, one LVDS receiver 70 is connected between two I/O pads 20 and 30. Pins 20 and 30 each have one conventional output buffer 60 and one conventional input buffer 50 to support general purpose I/O standards. Blocks 72, 52 and 62 are logic blocks that disable respective buffers. When differential input signals are required at pins 20 and 30, LVDS receiver 70 is enabled by logic circuit 72 while other blocks are disabled. Similarly, block 50 is activated for receiving single ended signal from pads 20 and 30, while block 60 is activated to give single ended outputs at pads 20 and 30.

In the scheme of FIG. 1, differential pins 20 and 30 can only support differential input mode and cannot operate in differential output mode. Pins 20 and 30 can independently support single ended input or output operations.

In FIG. 2, LVDS driver 600 is connected between two pads 20 and 30. Each of pads 20 and 30 incorporate one conventional output buffer 60 and one conventional input buffer 50. In the arrangement of FIG. 2, differential pins 20 and 30 can together support only differential output mode, while independently supporting single ended operation.

BRIEF SUMMARY OF THE INVENTION

The disclosed embodiments of the present invention are directed to programmable devices (like Field Programmable Gate Arrays, FPGA) and the capability to configure the functionality of their I/Os to support various interfacing standards, which may be either single ended (such as CMOS, TTL) or differential (such as Low Voltage differential Signaling, LVDS).

An advantage of this invention is it provides a scheme that supports differential and single ended signal protocols, with each pin of the device having one receiver and one transmitter connected to it and a differential receiver connected between the two pins. Yet another advantage is that it avoids the use of a dedicated output buffer for LVDS for differential output operation. Two single ended output buffers are configured to support the differential output operation.

A further feature of this invention is it reduces the total pad driver area when 5V tolerance is not required.

In accordance with one embodiment of the present invention, a configurable output buffer is provided that is capable of providing differential drive. It includes complementary pairs of CMOS transistors having a common output terminal and a common control terminal, and a second terminal of each CMOS transistor that is connected to its corresponding supply terminal through a current source/sink. The output stage includes inverters/buffers for single ended operation. The number of complementary pair of CMOS transistors is defined by the required maximum current sourcing/sinking capability of said output buffer. Ideally, the gate of each said current source/sink CMOS transistor is connected to a defined bias voltage.

The output buffer is preferably operated as a single ended transmitter during single-ended transmission and as one leg of a differential transmitter during differential transmission. The bias voltage is preferably generated internally by a bias cell.

In accordance with another aspect of the invention, a method for configuring an output buffer capable of providing differential drive is provided that includes the steps of connecting together the control terminals and output terminals of a pair of complementary CMOS, and attaching the second terminal of each CMOS transistor to its corresponding supply terminal through a current source/sink. Multiple CMOS transistors pair are connected in parallel where necessary to provide the required sourcing/sinking capability.

In accordance with another aspect of the invention, a device for single ended and differential signal protocols is provided that includes a first terminal coupled to a first receiver and a first transmitter; a second terminal coupled to a second receiver and a second transmitter; and a differential receiver coupled to the first and second terminals.

In accordance with a further aspect of the invention, an integrated circuit is provided that includes a first driver circuit having at least one leg, each leg including two PMOS devices in series with a voltage source and a first output, and two NMOS devices in series with a reference potential and the first output.

In accordance with yet another aspect of the invention, a configurable output buffer is provided that includes a first driver circuit comprising at least one leg, each leg comprising a single PMOS device coupled between a voltage source and a first output and an NMOS device coupled between a reference potential and the first output; a pre-driver circuit comprising at least one leg, each leg comprising first and second PMOS transistors series coupled between the voltage source and the first output and first and second NMOS devices series coupled between a reference potential and the first output; and a first pre-driver stage having outputs coupled to control terminals of the PMOS and NMOS devices and the pre-driver circuit and the driver circuit to support single-ended operation.

BRIEF DESCRIPTION OF THE ACCOMPANYING DRAWINGS

The invention will now be described with reference to the accompanying drawings.

DETAILED DESCRIPTION OF THE INVENTION

Figure 1:
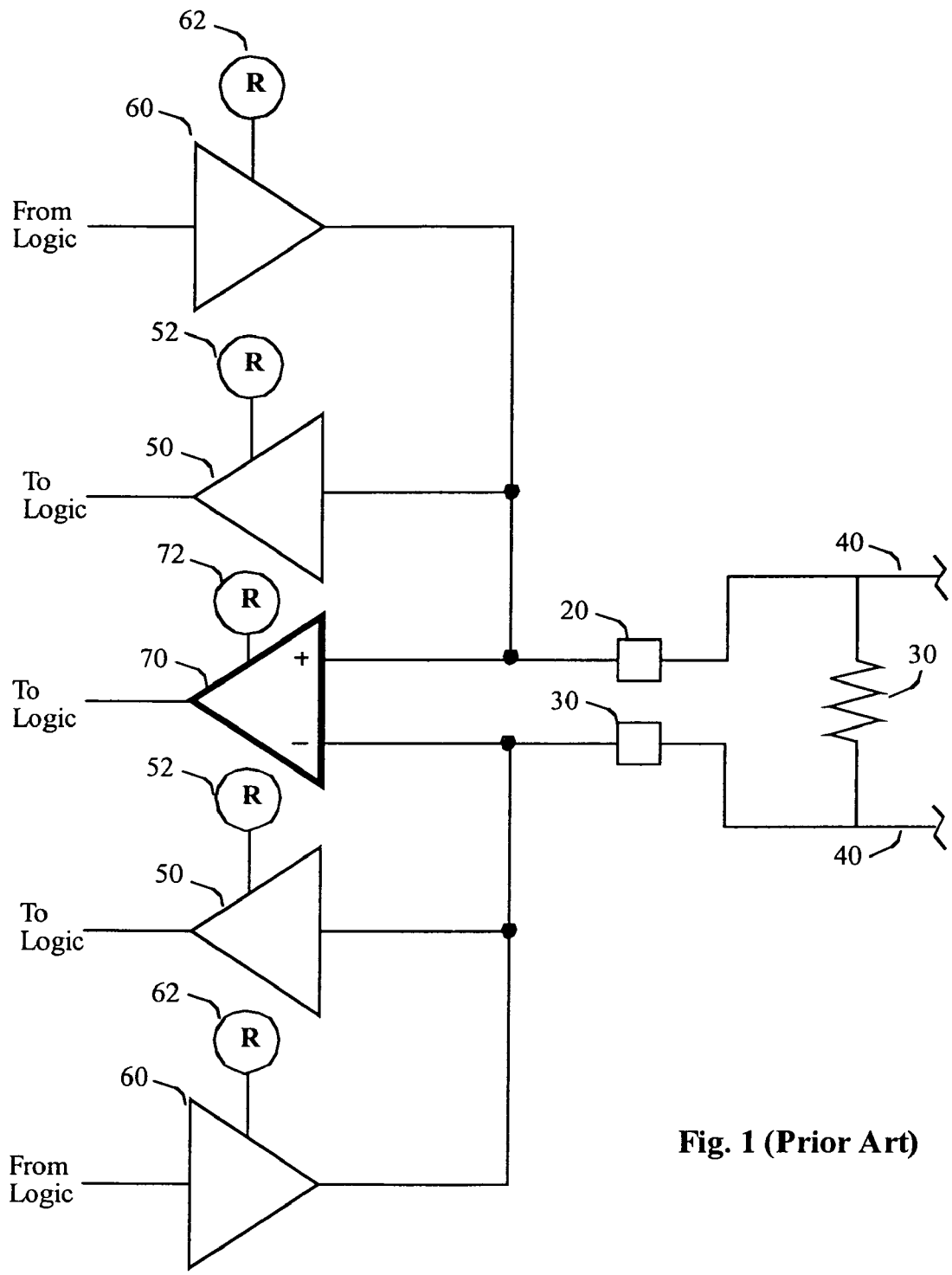
FIG. 1 shows a known scheme for supporting low voltage differential signaling input operation with other signaling protocols.
Figure 2:
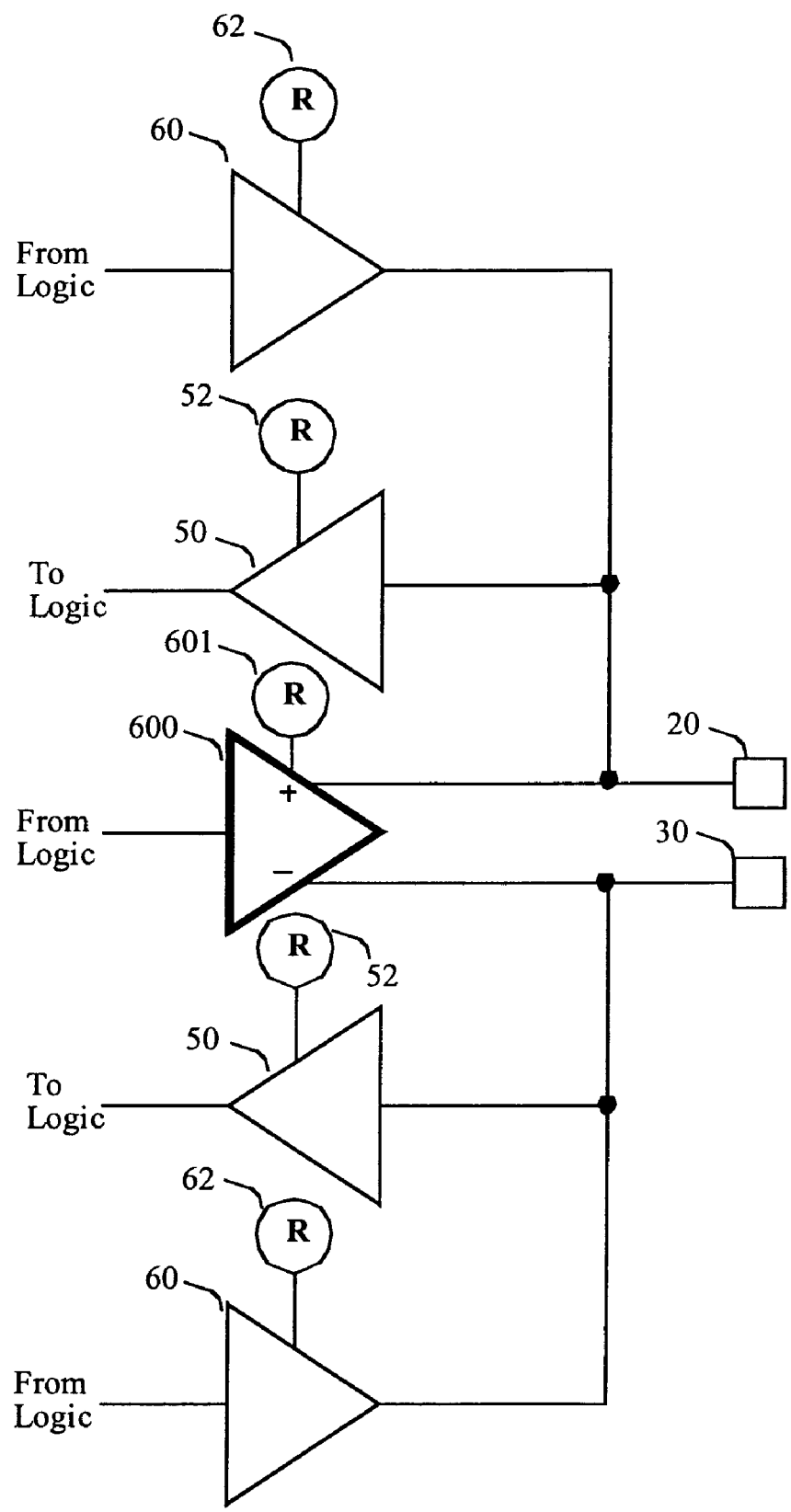
FIG. 2 shows a known scheme for supporting low voltage differential signaling output operation with other signaling protocols.
Figure 3:
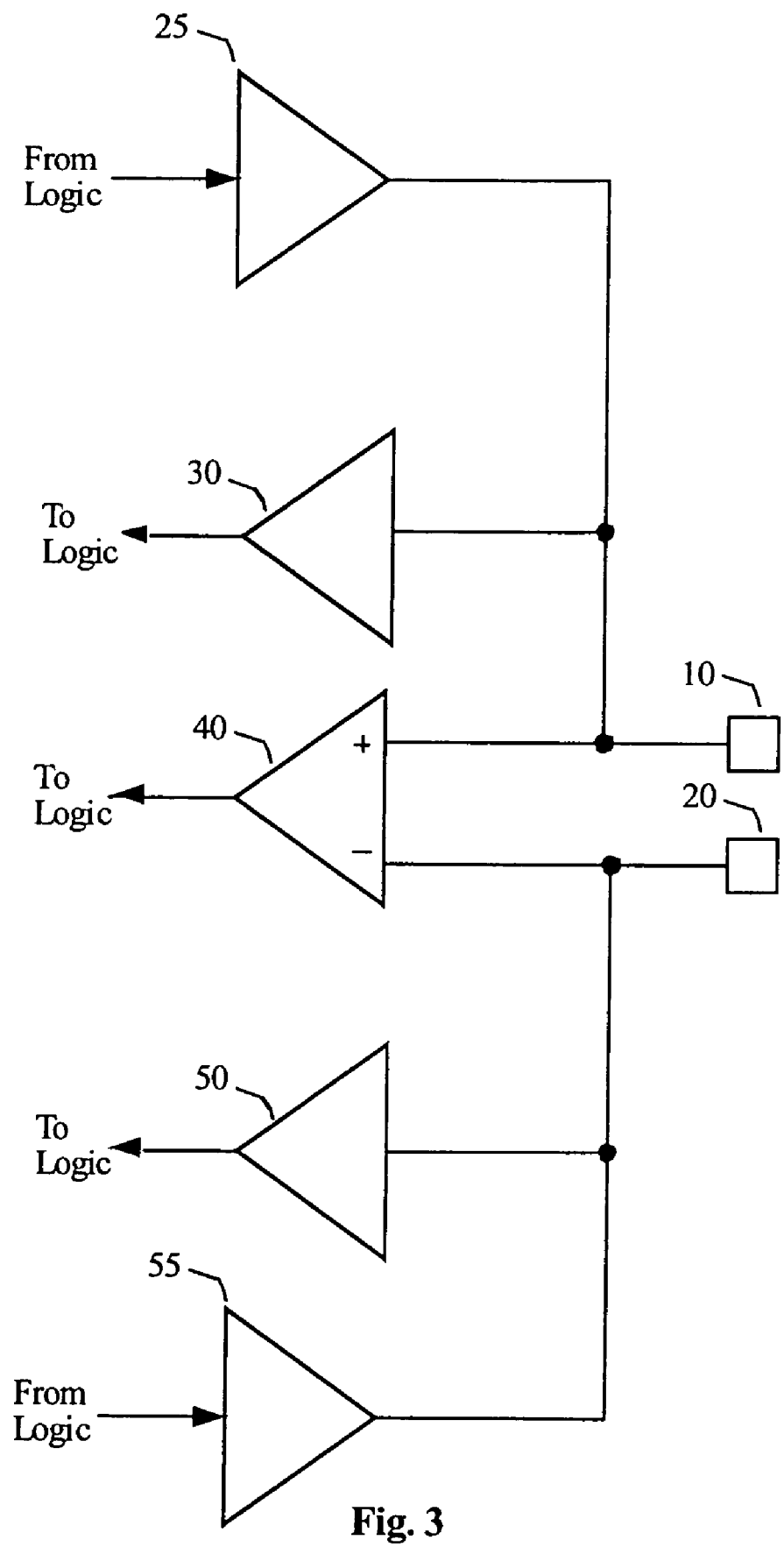
FIG. 3 shows a diagram for supporting low voltage differential signaling input and output operation with other signaling protocols according to the present invention.

FIG. 3 shows the simplified schematic block diagram of a portion of an FPGA device. In this figure, only two pins 10 and 20 are shown to explain the single ended and differential signaling operation in detail. Block 25 and 55 are output buffers having their outputs connected to pin 10 and 20 respectively. Output buffers 25 and 55 are identical and are capable of being configured for single ended or LVDS operation. Both output buffers operate independently to output single ended signals at pin 10 and 20 and operate together to output LVDS signals at pin pair 10-20.

Blocks 30 and 50 are input buffers, receiving their input signals from pins 10 and 20 respectively. Input buffers 30 and 50 are capable of supporting single ended signaling protocols. The block 40 is a differential receiver that receives its input signals from pin pair 10-20. The receiver 40 is capable of supporting LVDS input signal swings.

The pins 10 and 20 can be used for differential operation. For this mode of operation, differential receiver 40 is enabled and input buffers 30 and 50 along with the output buffers 25 and 55 are disabled. For differential output operation, the output buffers 25 and 55 are configured to generate mutually inverted signals at pin pair 10-20. The output buffers 25 and 55 are combined together and a resistance of 100 ohms (not shown here) is connected between the pins 10 and 20 (in real operation a transmission line is connected at pins 10 and 20 and a 100 ohm resistance is connected at the far end of transmission lines i.e., at the receiver end). Buffers 25 and 55 are configured in such a manner that the current flowing through the 100 ohm resistance remains within the range of the LVDS standard (2.5 mA to 4.5 mA) so that the differential output voltage remains in the range of 250 mV to 450 mV. In this case, the output buffers 25 and 55 are driven by the same input signal from the core logic.

The pins 10 and 20 can also be used for single-ended input operation. For this mode of operation the differential receiver 40 and the output buffers 25 and 55 are disabled and the input buffers 30 and 50 are enabled. Similarly, for single-ended output operation, the output buffers 25 and 55 are configured to independently drive the pins 10 and 20 respectively. In this case, the output buffers 25 and 55 are driven by separate input signals from the core logic.

Figure 4:
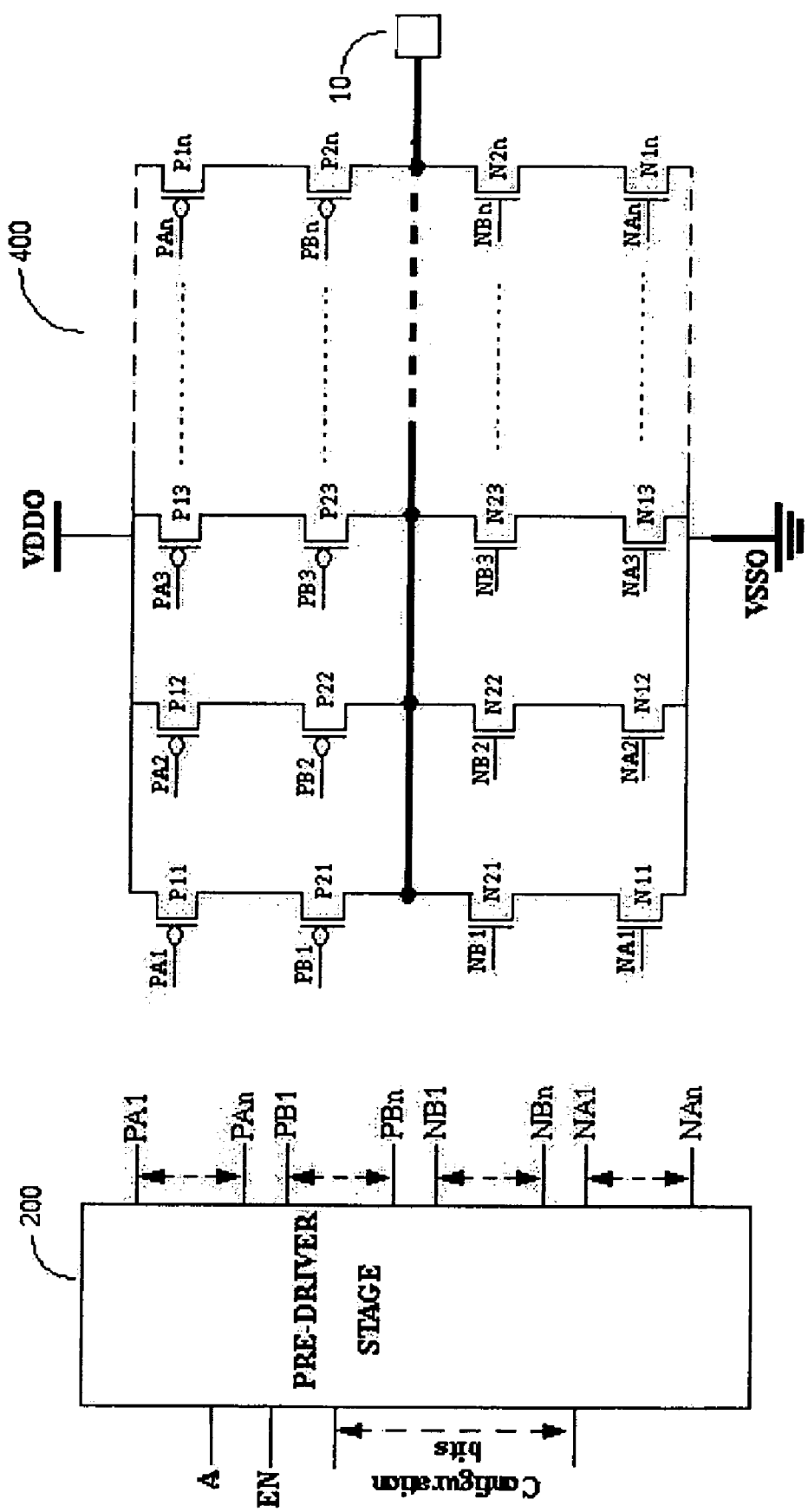
FIG. 4 shows the proposed architecture of the output buffer used in FIG. 3 according to the present invention.

FIG. 4 shows the schematic of the output buffer (25 or 55 in FIG. 3) architecture according to the first embodiment. Block 200 is the pre-driver stage, which has inputs A, EN and configuration bits. A is the input of the output buffer coming from the core. EN is the enable signal to enable or disable the output buffer. The pre-driver stage also has some configuration bits, which configure the buffer for different signaling protocols. Outputs of the pre-driver are PA1 to PAn, PB1 to PBn, NA1 to NAn and NB1 to NBn. The outputs of the pre-driver stage control the operation of pad driver 400. Here 'n' is the number of legs used in pad driver circuit 400. It is not necessary that the number of legs of PMOSs and NMOSs are equal. The required number of PMOSs and NMOSs are decided by the maximum sourcing and sinking current capability required for the output buffer. Each leg of the pad driver circuit has two PMOSs in series between pad 10 and power supply VDDO and two series NMOSs between pad 10 and ground VSSO. This type of pad driver circuit is useful for 5V tolerant IOs as described in U.S. Pat. No. 6,018,257. Since FPGAs are generally operated in a multi-voltage environment, 5V tolerance is necessary for the IOs.

In pad driver circuit 400, PMOSs P11 to P1n form the upper array of PMOSs, and PMOSs P21 to P2n form the lower array. In the same manner, NMOSs N11 to N1n form the lower array and N21 to N2n form the upper array. The gates of the all transistors of the pad driver 400 are controlled by the pre-driver circuitry. The different configuration bits control the signals controlling the pad driver transistors. This pad driver circuitry is capable of supporting any single ended signaling protocol.

Figure 5:
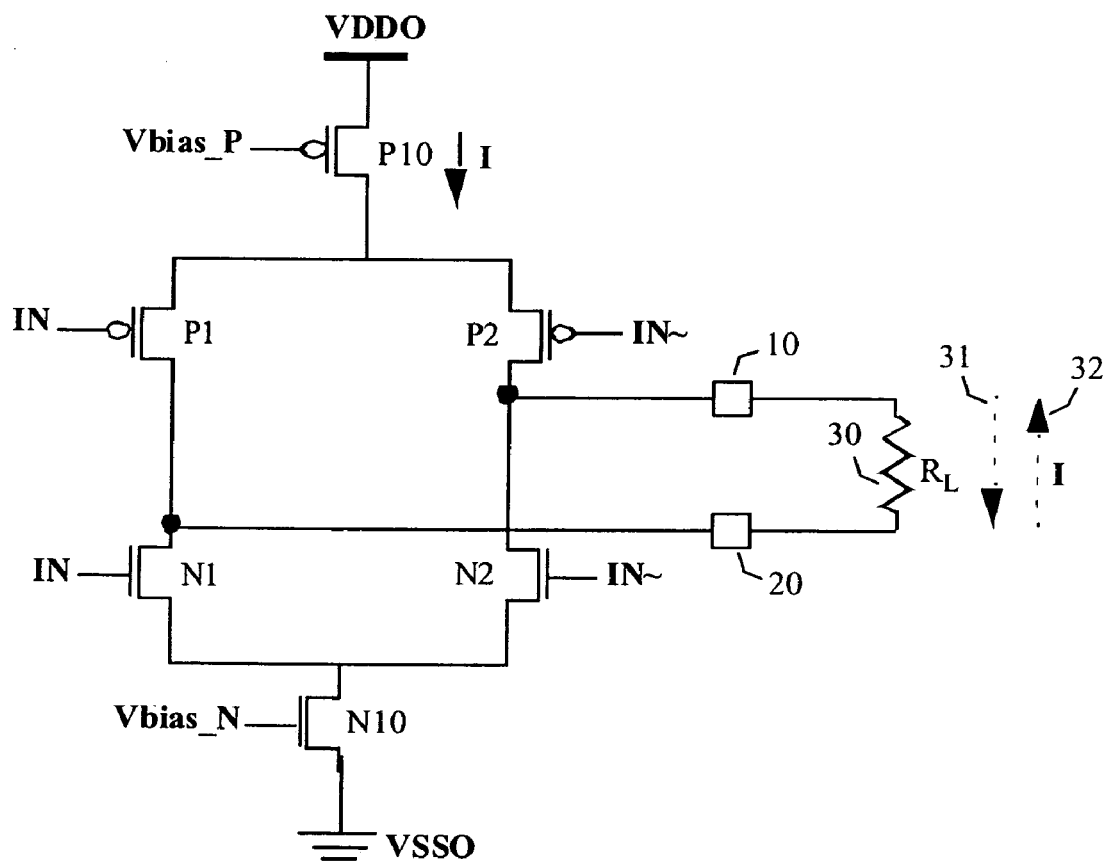
FIG. 5 shows a conventional driver for low voltage differential signaling.

FIG. 5 shows the conventional LVDS driver architecture. PMOS P10 acts as a current source, having its gate connected to a current reference voltage Vbias_P and its source is connected to the supply voltage VDDO. Vbias_P is generated from a bias cell and its value is so that it allows P10 to source constant current 1. NMOS N10 acts as a current sink, having its gate connected to a current reference voltage Vbias_N and its source is connected to the ground terminal VSSO. Vbias_N is also generated from the bias cell and its value is such that it allows NMOS N10 to sink a constant current I. Four transistors P1, P2, N1 and N2 form a current steering circuit. The gates of P1 and N1 are controlled by an input signal IN and gates of P2 and N2 are controlled by complementary signal IN~. It is required that there should be no skew between the signals IN and IN~. The drains of P1 and N1 are connected together to the pad 20 and the drains of P2 and N2 are together connected to the pad 10. A 100 ohm resistance 30 is connected between pads 10 and 20 (the resister is connected at the receiver end after the transmission lines, which are not shown here).

When IN=1, IN~=0, P2 and N1 are on, while P1 and N2 are off, causing the current steering circuit to steer the current I in the direction indicated by arrow 31, resulting in node 10 being at a higher voltage level (VOH) and node 20 at a lower voltage level (VOL). When IN=0, IN~=1, P1 and N2 are on while P2 and N1 are off, so the current steering circuit steers current in the direction shown by arrow 32, which causes node 20 to be at a higher voltage level (VOH) and 10 at a lower voltage level (VOL). So, the requirement for the LVDS driver is: a current source, a current sink and a current steering circuitry which steers the direction of current through output resister according to the change in input signal.

Figure 6:
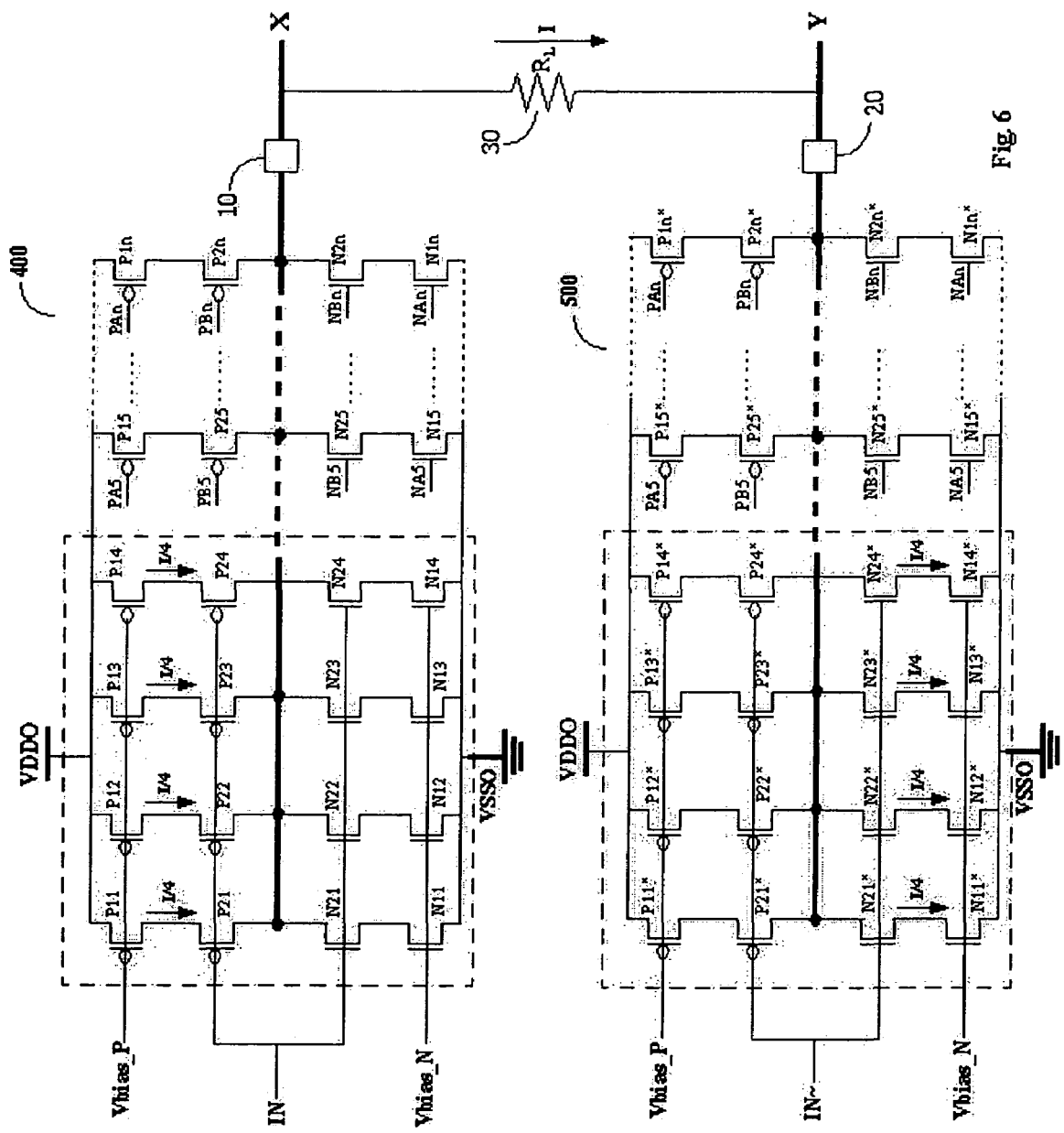
FIG. 6 shows a schematic diagram of a pair of output buffers configured for low voltage differential signaling operation according to the present invention.

FIG. 6 shows the implementation of the LVDS driver using two single ended output buffers. Only the pad driver circuitry of output buffer of FIG. 4 has been shown. The pre-driver block connects the gates of the pad driver MOSs to corresponding inputs and control signals (e.g., Vbias_N, Vbias_P, IN, etc.).

Pad drivers 400 and 500, connected to pads 10 and 20 respectively. A 100 ohm resistance 30 is connected between pads 10 and 20. Since the current requirement of LVDS (2.5 mA to 4.5 mA) is much less then the total current provided to the pad drivers (more then 16 mA, for example), all the legs of the pad driver circuitry are not used to implement a current source or sink. In FIG. 6, for example, four legs out of total 'n' legs are used for the LVDS driver. In this example, Vbias_P makes P11 a current source which can source I/4 current. To get total current I, four such current sources in series are required. So gates of four PMOSs i.e., P11 to P14, are connected to the bias voltage Vbias_P by the pre-driver circuit. In the same manner, Vbias_N makes N11 a current sink which can sink I/4 current. It is not necessary that the number of legs of PMOSs and NMOSs are equal for implementing the LVDS driver.

The size of a leg of the pad driver is pre-decided and the variables which can be varied to design a current source and sink are Vbias_P and Vbias_N. Vbias_P is adjusted to the value which can make a top PMOS (as P11) a current source having a capability to source a current I/m, (m<n), so a total 'm' number of legs are required to be connected in parallel to get the required total current of I. In the same manner, for designing the current sink, the value of Vbias_N is adjusted to the value which can make a bottom NMOS (as N11) a current sink having capability to sink a current I/p, (p<n), so the total 'p' number of legs are required to be connected in parallel to get the total sinking capability of I.

The lower PMOSs P21–P24 and upper NMOSs N21–N24 are connected to the input signal IN. These transistors act as current steering circuitry. Here the number of PMOSs used for current steering should be equal to the number used for current source and number of NMOSs used for current steering circuit should be equal to the number used for current sink circuitry. This reduces the resistance of current steering transistors, and its value will be negligible as compared to current source or current sink transistors.

In FIG. 6, for differential operation pad driver 400 is configured as follows: The gates of P11 to P14 are connected to Vbias_P, the gates of NMOSs N11 to N14 are connected to Vbias_N, the gates of P21 to P24, and the gates of N21 to N24 are connected to input signal IN. The gates of the remaining PMOSs are connected to VDDO while the gates of the remaining NMOSs are connected to VSSO. Pad driver 500 is configured as follows: the gates of P11* to P14* are connected to Vbias_P, the gates of N11* to N14* are connected to Vbias_N, the gates of P21* to P24*, and the gates of N21* to N24* are connected to IN~. The gates of the remaining PMOSs are connected to VDDO, and the gates of other NMOSs are connected to VSSO.

When IN=0, IN~=1, PMOSs P21 to P24 and NMOSs N21* to N24* are on, which steers current I in the shown direction from X to Y. Each branch of pad driver 400 sources current I/4 and in pad driver 500 each NMOS leg sinks I/4 current. Since current flows from X to Y, X will be at higher voltage level (VOH) and Y will be at lower voltage level (VOL). When IN=1, IN~=0, PMOSs P21* to P24* and NMOSs N21 to N24 are on, which steers current I from Y to X, which puts Y at a higher voltage level (VOH) and X at lower voltage level (VOL).

Figure 7:
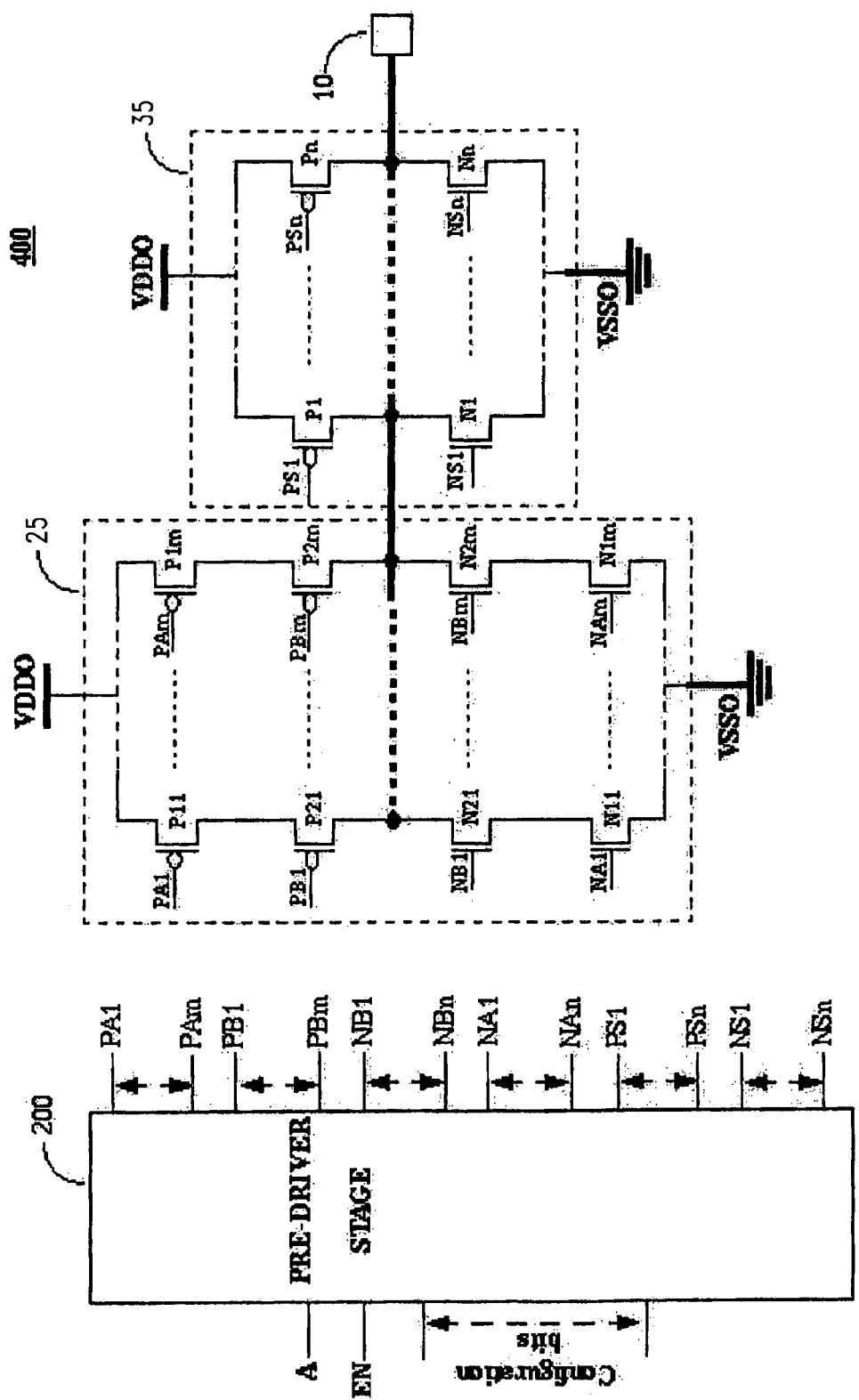
FIG. 7 shows another architecture of the output buffer used in FIG. 3 according to the present invention.

FIG. 7 shows another architecture of the output buffer. This type of architecture is used when 5V tolerance is not required for the IOs. This architecture saves the area of pad driver circuitry as compared to that of FIG. 5. The pre-driver circuitry may be the same as of FIG. 5; the only difference is the numbers of outputs are different. In the pad driver circuitry, the 'm' legs have two series PMOSs and two series NMOSs. The number 'm' is decided by the driving capability of the LVDS driver that is in between 2.5 mA to 4.5 mA. Here also the number of PMOS legs and NMOS legs may or may not be the same. In FIG. 7 it is shown to be equal, just for an example. The pad driver portion 35 has only one NMOS and one PMOS in each leg. Here in portion 35, total 'n' numbers of legs are used. Again for portion 35, the number of PMOS legs and the number of NMOS legs may or may not be equal. If in single ended operation maximum current capability of IO is required IDDO, then the combined current capability of portions 25 and 35 should be IDDO. Since for LVDS the number 'm' is already decided, 'n' can be decided by the IDDO requirement.

Figure 8:
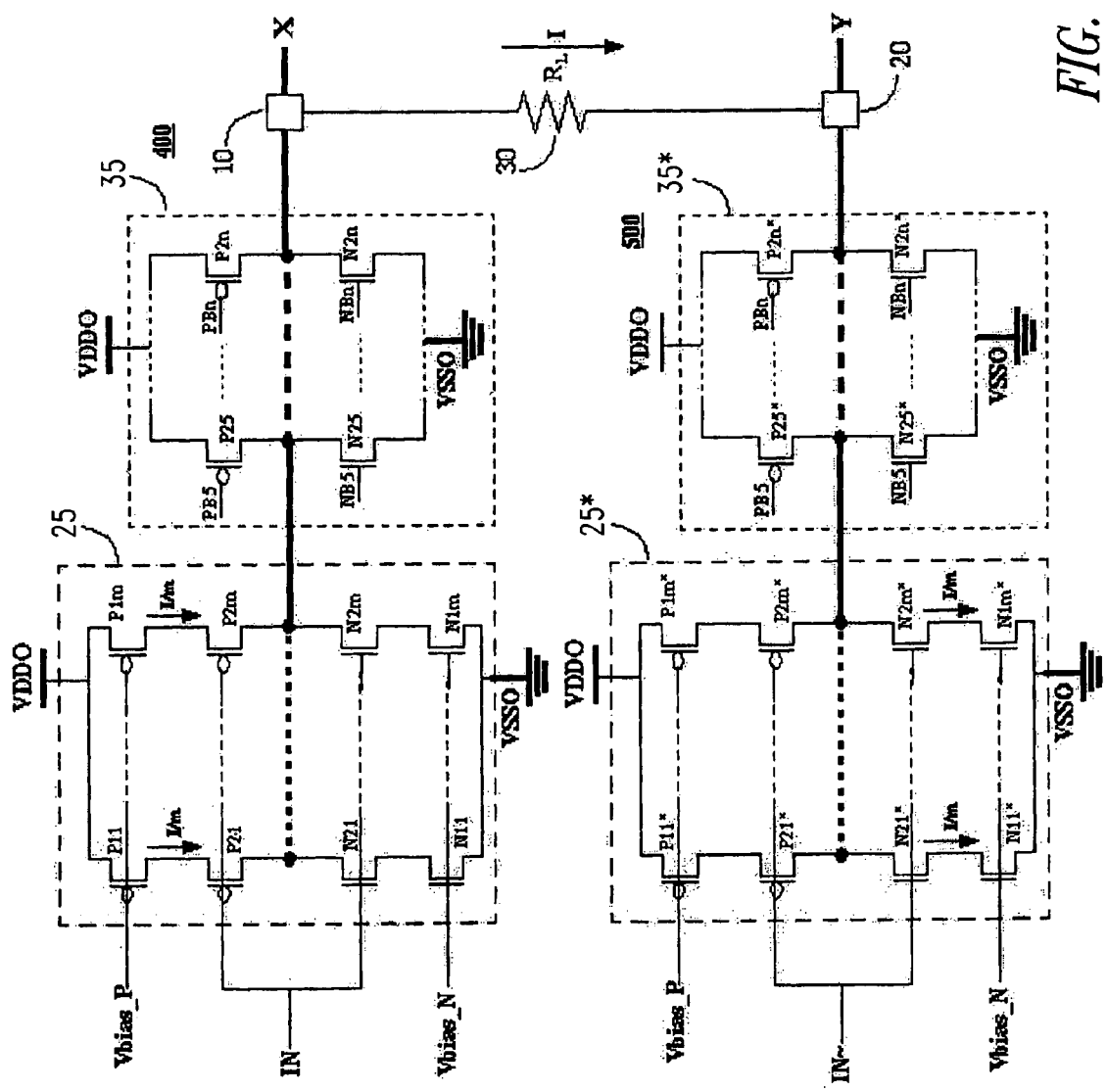
FIG. 8 shows a schematic diagram of a pair of output buffers of FIG. 7 configured for low voltage differential signaling operation according to the present invention.

FIG. 8 shows the implementation of LVDS output operation by using two adjacent output buffers 400 and 500. The pad driver is configured in such a manner that it connects the gates of all top PMOSs of portions 25 and 25* with Vbias_P and all bottom NMOSs of portions 25 and 25* with Vbias_N. PMOSs and NMOSs directly connected to pad have their gates connected to the input signals IN and IN~ as shown. The gates of all PMOSs of portions 35 and 35* are connected to VDDO while the gates of all NMOSs of portions 35 and 35* are connected to the ground voltage VSSO.

Bias voltage Vbias_P has the capability of making P11 a current source that can source I/m current. Vbias_N has the capability to make N11 a current sink which can sink I/m current. So here total 'm' branches are used. When IN=0, IN~=1, transistors P21 to P2m and N21* to N2m* are on. So a total current I flows through the external resistance 30 from X to Y, which brings pad 10 to a higher voltage level (VOH) and pad 20 to a lower voltage level (VOL). When IN=1, IN~=0, and transistors P21* to P2m* and N21 to N2m are on. So a total current I flows through the external resistance 30 from Y to X, which makes pad 20 at high voltage level (VOH) and pad 10 at lower voltage level (VOL).

For LVDS output operation two current reference signals Vbias_P and Vbias_N are required. A bias cell generates these bias voltages. If all the IOs are given LVDS capability, it is not required to give bias cell to each buffer. One bias cell can be used to supply bias voltages to all IOs. When a particular group of IOs are configured for LVDS, the pre-driver stage connects the required transistors of these IOs to Vbias_P and Vbias_N. Metals rails, one for Vbias_P and one for Vbias_N, are used around the periphery (just above the IO cells) of the chip to rout these two bias signals. Since these bias signals are providing bias voltages and no current (except leakage current) is flowing through their routing lines, so the metal width for these rails can be kept at minimum value. But using one bias cell will create a problem due to coupling. If any signal line runs parallel to the bias voltage line, any state change in that line will couple with the bias voltage line, which produces noise on these lines and there may be change in the voltage value. The effect of coupling will increase as the distance from the bias cell is increased. Since the value of bias voltages is very critical for the constant current operation of the LVDS driver, so the bias rails should be noise free. One method to reduce the effect of coupling in the bias rails is to provide more than one bias cells as shown in FIG. 9.

Figure 9:
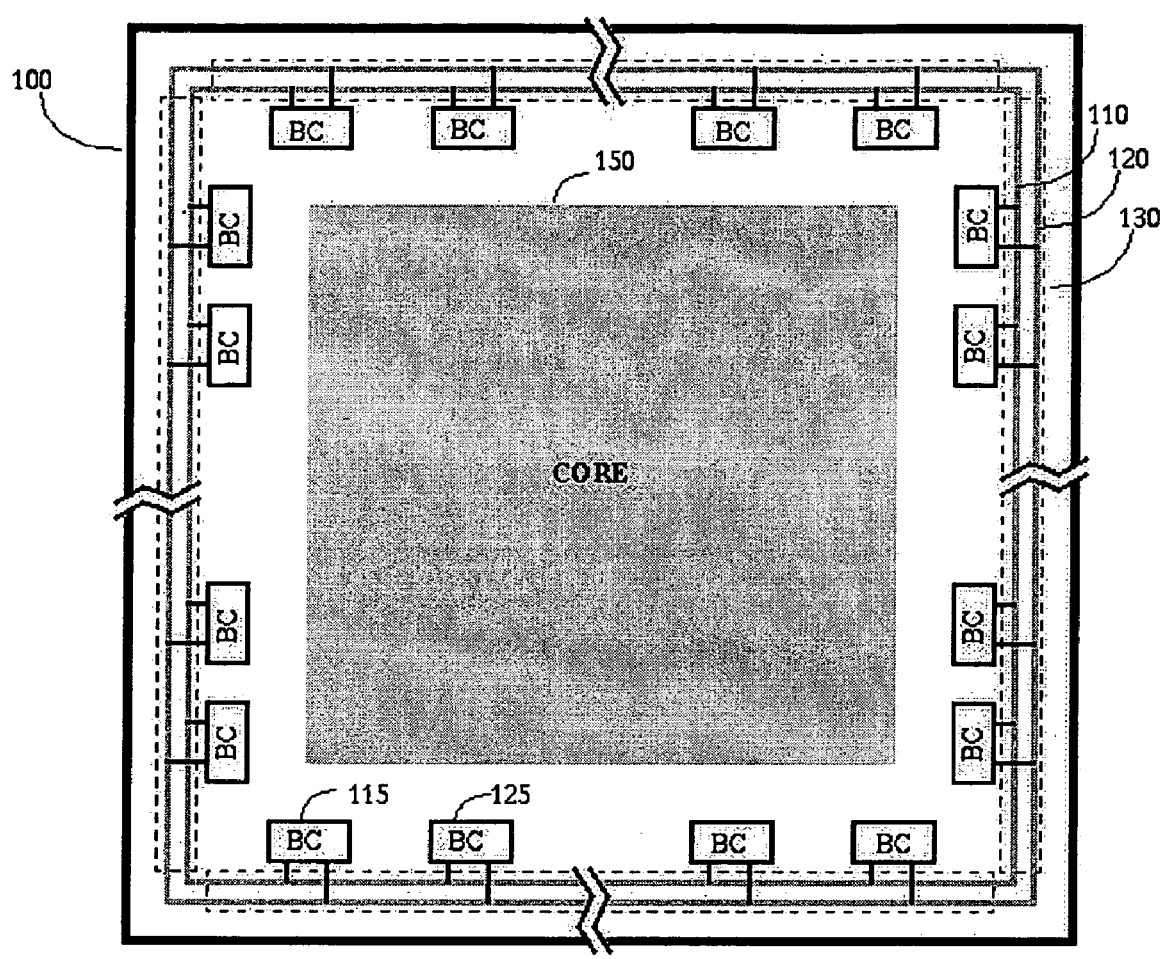
FIG. 9 shows the scheme of placing bias cells and providing bias voltages to all IO cells according to the present invention.

In FIG. 9, block 100 represents a chip, which has a core 150. Reference number 130 is the portion in the chip where IOs are placed. 110 is the rail for Vbias_P, and 120 is the rail for bias voltage Vbias_N. Reference numbers 115 and 125 refer to the similar blocks, which are the bias cells (in FIG. 9 these cells are named as BC). In FIG. 9, bias cells are used at regular intervals, which are connected to the bias voltage rails. There may be one bias cell for eight IO cells. This scheme reduces the effect of coupling on bias rails due to adjacent signal lines because bias cells BCs are regularly forcing the bias voltages to the rails.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

We claim:

1. A configurable output buffer capable of providing differential drive, comprising:
complementary pairs of CMOS transistors having a common output terminal and a common control terminal;
a second terminal of each CMOS transistor connected to its corresponding supply terminal through one of a respective current source and current sink; and
an output stage that includes inverters and buffers for single ended operation
wherein said configurable output buffer can operate in differential drive operation and single ended operation.

2. The configurable output buffer of claim 1 wherein the number of complementary pairs of CMOS transistors is defined by a required maximum current sourcing and maximum current sinking capability of said output buffer.

3. The configurable output buffer of claim 1 wherein the gate of each CMOS transistor that is configured as a current source and each CMOS transistor that is configured as a current sink is connected to a defined bias voltage.

4. The configurable output buffer of claim 1 wherein said output buffer is operated as a single ended transmitter during single-ended transmission and as one leg of a differential transmitter during differential transmission.

5. The configurable output buffer of claim 3 wherein said bias voltage is generated internally by a bias cell.

6. A method for configuring an output buffer capable of providing differential drive, comprising the steps of:
providing complementary pairs of CMOS transistors having a common control terminal and a common output terminal;
coupling the second terminal of each said CMOS transistor to its corresponding supply terminal through one of a respective current source and current sink; and
providing an output stage that includes inverters and buffers for single ended operation,
wherein said configurable output buffer can operate in different drive operation and single ended operation.

7. The method of claim 6 wherein multiple complimentary CMOS transistor pairs are connected in parallel to provide a required respective current sourcing and current sinking capability.

8. The method of claim 6 wherein the gate of each current source and current sink CMOS transistor is connected to a defined bias voltage.

9. The method of claim 6 wherein said output buffer is operated as single ended transmitter during single-ended transmission and as one leg of a differential transmitter during differential transmission.

10. The method of claim 8 wherein said bias voltage is generated internally by a bias cell.

11. An integrated circuit, comprising:
a first driver circuit having at least one leg, each leg including two PMOS devices in series with a voltage source and a first output, and two NMOS devices in series with a reference potential and the first output, the devices coupled together in complementary CMOS pairs, each CMOS pair having a common control terminal and a common output terminal, and a second terminal of each CMOS pair coupled to a respective current source and current sink; and
respective inverters and buffers coupled to each CMOS pair for single ended operation and as one leg of a differential transmitter during differential operation,
wherein said configurable output buffer can operate in different drive operation and single ended operation.

12. The circuit of claim 11, comprising a first pre-driver stage having outputs coupled to the common control terminal of the PMOS and NMOS devices in the first driver circuit.

13. The circuit of claim 12, wherein the first pre-driver stage and the first circuit are configured to support single-ended signal protocol.

14. The circuit of claim 13, comprising a second output coupled to the first output, a second pre-driver stage coupled to a second driver circuit that is coupled to the second output, the first and second pre-driver stages and respective first and second driver circuits each configured to support single-ended signal protocol on their respective first and second outputs and to operate as one leg of a differential output during differential operation.

15. A configurable output buffer, comprising:
a first driver circuit comprising at least one leg, each leg comprising a single PMOS device coupled between a voltage source and a first output and an NMOS devices coupled between a reference potential and the first output;
a first pre-driver circuit comprising at least one leg, each leg comprising first and second PMOS transistors series coupled between the voltage source and the first output and first and second NMOS devices series coupled between a reference potential and the first output;
a first pre-driver stage having outputs coupled to control terminals of the PMOS and NMOS devices in the pre-driver circuit and in the driver circuit to support single-ended operation; and
a second driver circuit, a second pre-driver stage coupled to a second output, the second output and the first output coupled together via a resistive device, the second driver circuit, second pre-driver circuit, and second pre-driver stage configured to support single-ended operation on the second output and to cooperate with the first driver circuit, first pre-driver circuit, and first pre-driver stage to support differential operation on the first and second outputs.

16. A configurable output buffer, comprising:
a plurality of transistor pairs, each pair having a common output terminal and common control terminal, and a second terminal of each pair coupled to a respective current source and current sink; and
respective inverters and buffers coupled to the transistor pairs for single ended operation and as one leg of a differential transmitter during differential operation.

17. The buffer of claim 16 wherein each transistor pair comprises a complimentary pair of CMOS transistors.

18. The buffer of claim 16 wherein at least one pair of the plurality of transistor pairs has the common control terminal coupled to a bias voltage.

* * * * *